(12) United States Patent
Li et al.

(10) Patent No.: US 7,885,058 B2
(45) Date of Patent: Feb. 8, 2011

(54) COVER ASSEMBLY

(75) Inventors: Chang-Zhi Li, Shenzhen (CN); Qi-Xiang Wen, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 52 days.

(21) Appl. No.: 12/391,355

(22) Filed: Feb. 24, 2009

(65) Prior Publication Data

US 2010/0128420 A1      May 27, 2010

(30) Foreign Application Priority Data

Nov. 27, 2008   (CN)   .......................... 200810305794

(51) Int. Cl.
   *H05K 5/00*   (2006.01)
   *H05K 7/00*   (2006.01)
   *H04M 1/00*   (2006.01)

(52) U.S. Cl. ............................... 361/679.01; 455/575.8

(58) Field of Classification Search ............ 361/679.01, 361/679.4, 679.45, 679.58; 384/276; 439/135; 455/575.8; 379/433.11
   See application file for complete search history.

(56) References Cited

U.S. PATENT DOCUMENTS

2006/0154520 A1 *   7/2006   Gennai et al. ............... 439/578

FOREIGN PATENT DOCUMENTS

JP      2005093219 A   *   4/2005

* cited by examiner

*Primary Examiner*—Jayprakash N Gandhi
*Assistant Examiner*—Anthony M Haughton
(74) *Attorney, Agent, or Firm*—Steven M. Reiss

(57) ABSTRACT

A cover assembly used in a portable electronic device is described. The cover assembly includes a body member defining an earphone hole and a cover member defining a through hole. The cover member is rotatably mounted to the body member to cover or expose the earphone hole.

7 Claims, 5 Drawing Sheets

COVER ASSEMBLY

BACKGROUND

1. Technical Field

The present disclosure relates to a cover assembly and, particularly, to a cover assembly used in a portable electronic device for covering an earphone hole.

2. Description of Related Art

Portable electronic devices (e.g., mobile phones) usually have earphone holes for insertion of earphones. Covers may be used to cover and protect the earphone holes from e.g., water and dust.

A typical earphone cover is often made of rubber and is fixedly connected to the mobile phone by a flexible strip adjacent to the earphone hole. The covering/exposing of the earphone hole is achieved by bending the earphone cover towards/away from the earphone hole around the flexible strip.

However, the flexible strip may not endure frequent use and break.

Therefore, there is room for improvement within the art.

BRIEF DESCRIPTION OF THE DRAWINGS

Many aspects of the cover assembly can be better understood with reference to the following drawings. These drawings are not necessarily drawn to scale, the emphasis instead being placed upon clearly illustrating the principles of the present cover assembly. Moreover, in the drawings like reference numerals designate corresponding members throughout the several views.

DETAILED DESCRIPTION OF EXEMPLARY EMBODIMENT

Figure 1:
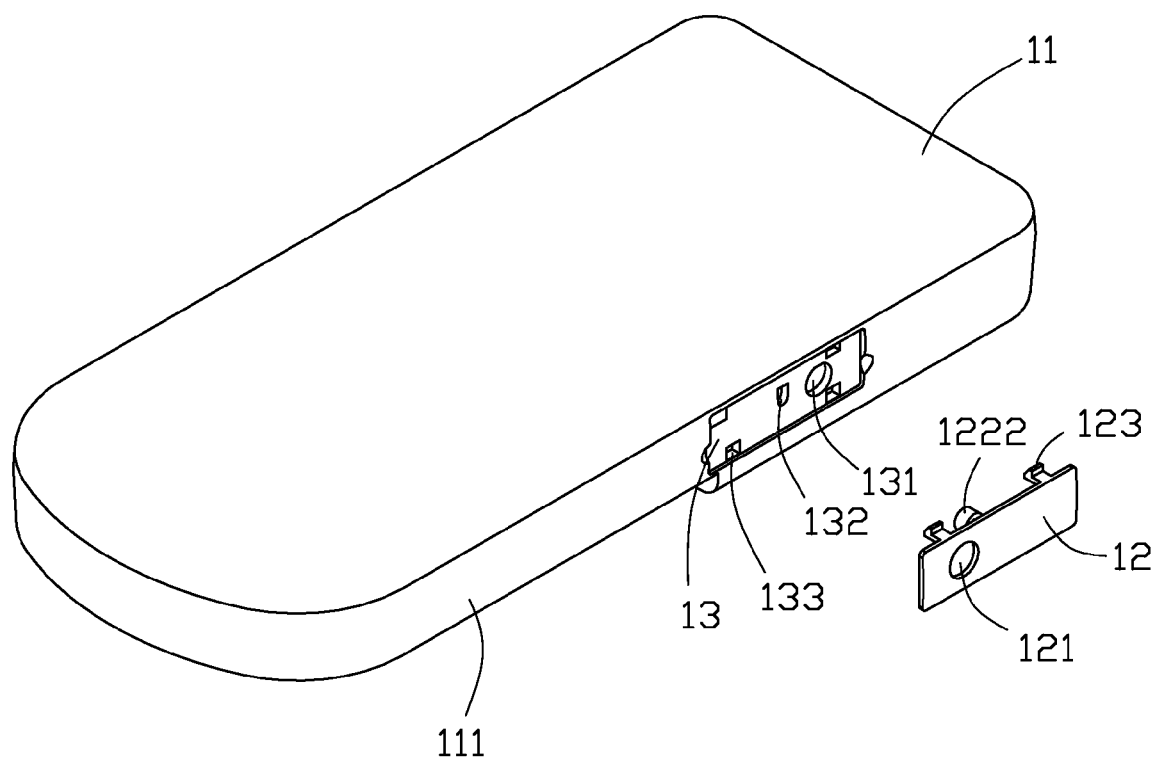
FIG. 1 is an exploded, isometric view of a cover assembly, in accordance with an exemplary embodiment.
Figure 3:
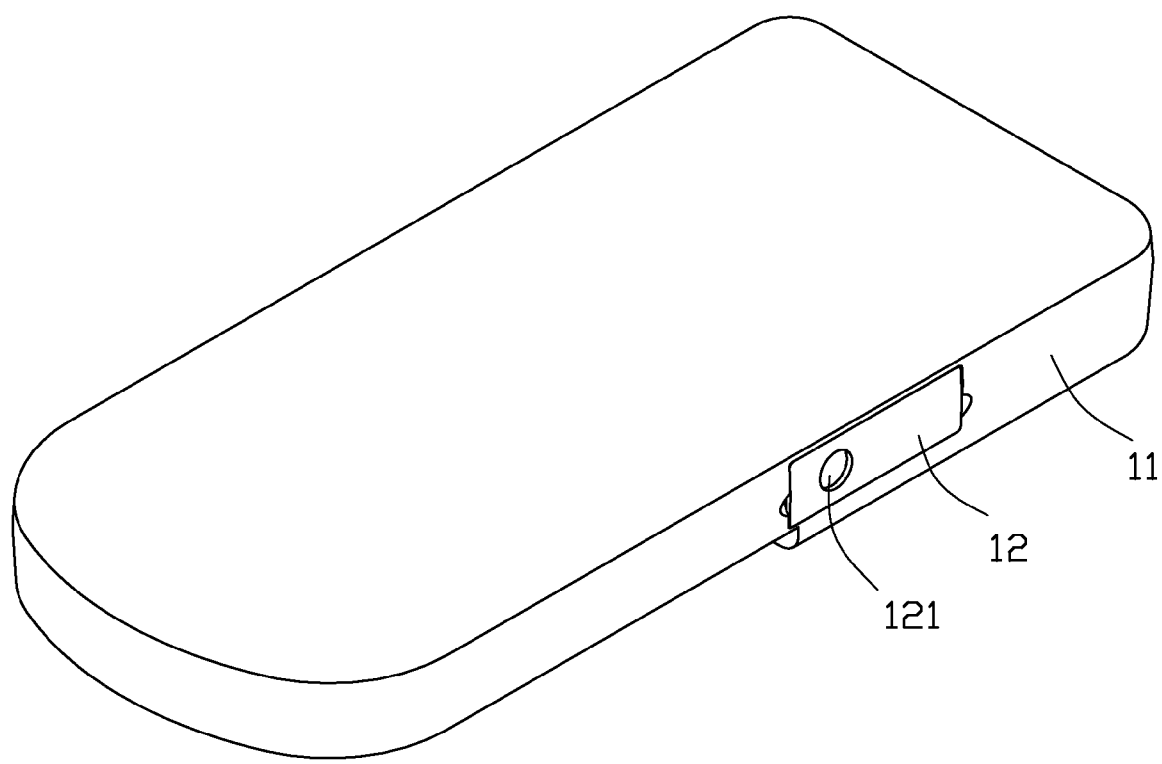
FIG. 3 is an assembly view of the cover assembly shown in FIG. 1.

FIGS. 1 and 3 show an exemplary cover assembly 10 used in a portable electronic device (e.g., mobile phone). The cover assembly 10 includes a body member 11 and a cover member 12. The cover member 12 is rotatably connected to the body member 11.

The body member 11 can be a housing of the portable electronic device. The body member 11 includes a peripheral wall 111. The peripheral wall 111 has a recessed portion defining a mounting portion 13. The mounting portion 13 is configured to receive the cover member 12 therein such that the cover member 12 is flush with the peripheral wall 111. The mounting portion 13 defines an earphone hole 131 and a hole 132. The hole 132 is adjacent to the earphone hole 131. The mounting portion 13 further defines a plurality of latching slots 133 surrounding the earphone hole 131 and the hole 132.

Figure 2:
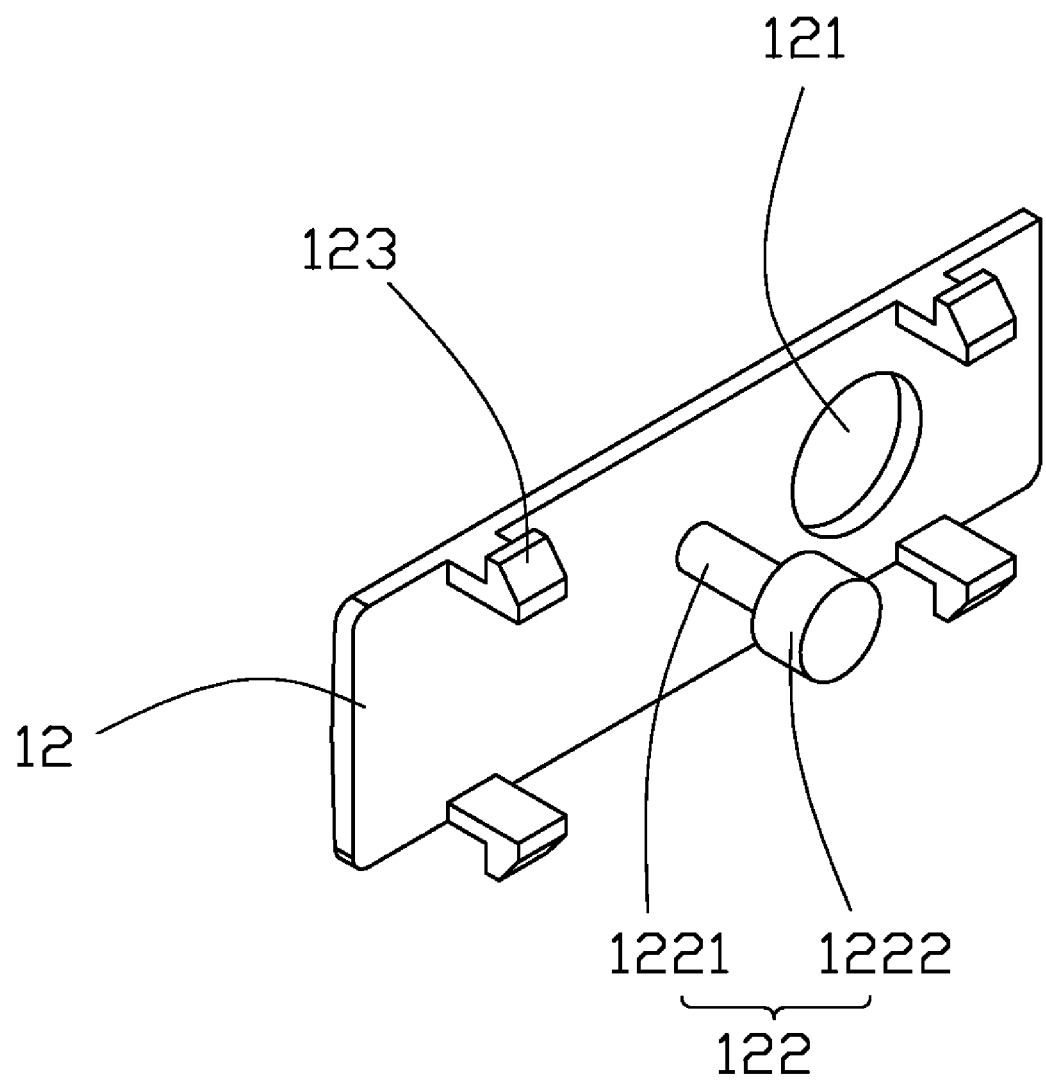
FIG. 2 is another isometric view of the cover member shown in FIG. 1.

Referring to FIG. 2, the cover member 12 is a plate and defines a through hole 121 corresponding to the earphone 131. A rotating column 122 and a plurality of latches 123 protrude from one side of the cover member 12. The rotating column 122 includes a rotating portion 1221 and a resisting portion 1222 connected to the rotating portion 1221. The rotating portion 1221 is rotatably received in the hole 132. The resisting portion 1222 has a substantial deformation capability and is configured to be received in the body member 11 and abut against the inner wall of the body member 11 through the hole 132. The distance between the rotating column 122 and the through hole 121 is equal to that between the earphone hole 131 and the hole 132.

In assembly, the resisting portion 1222 of the rotating portion 122 is deformed and moved into the body member 11 through the hole 132. The rotating portion 1221 is rotatably received in the hole 132. Each latch 123 latches into the corresponding latching slot 133. At this time, the earphone hole 131 is misaligned with the through hole 121 and covered by the cover member 12.

Figure 4:
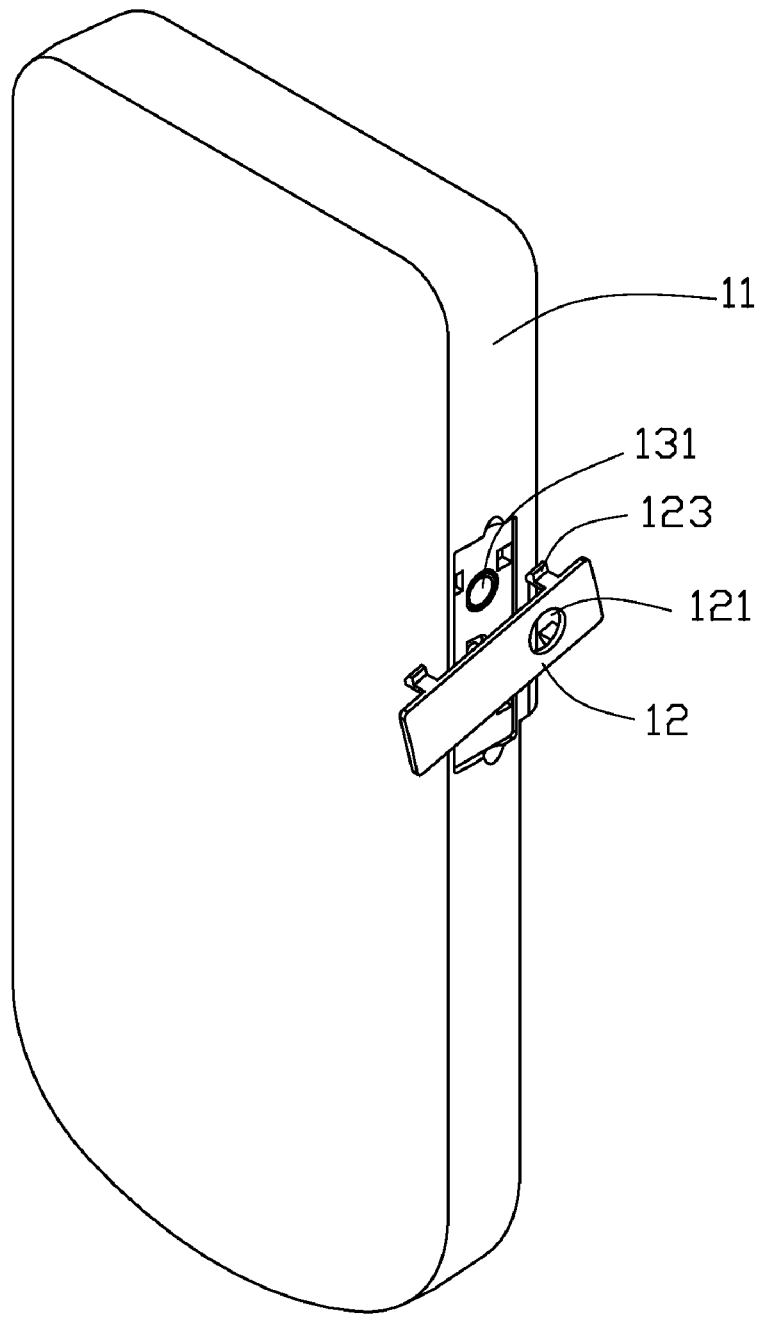
FIG. 4 is a first position of the cover assembly shown in FIG. 3, corresponding to an opening/closing operation of the cover assembly.
Figure 5:
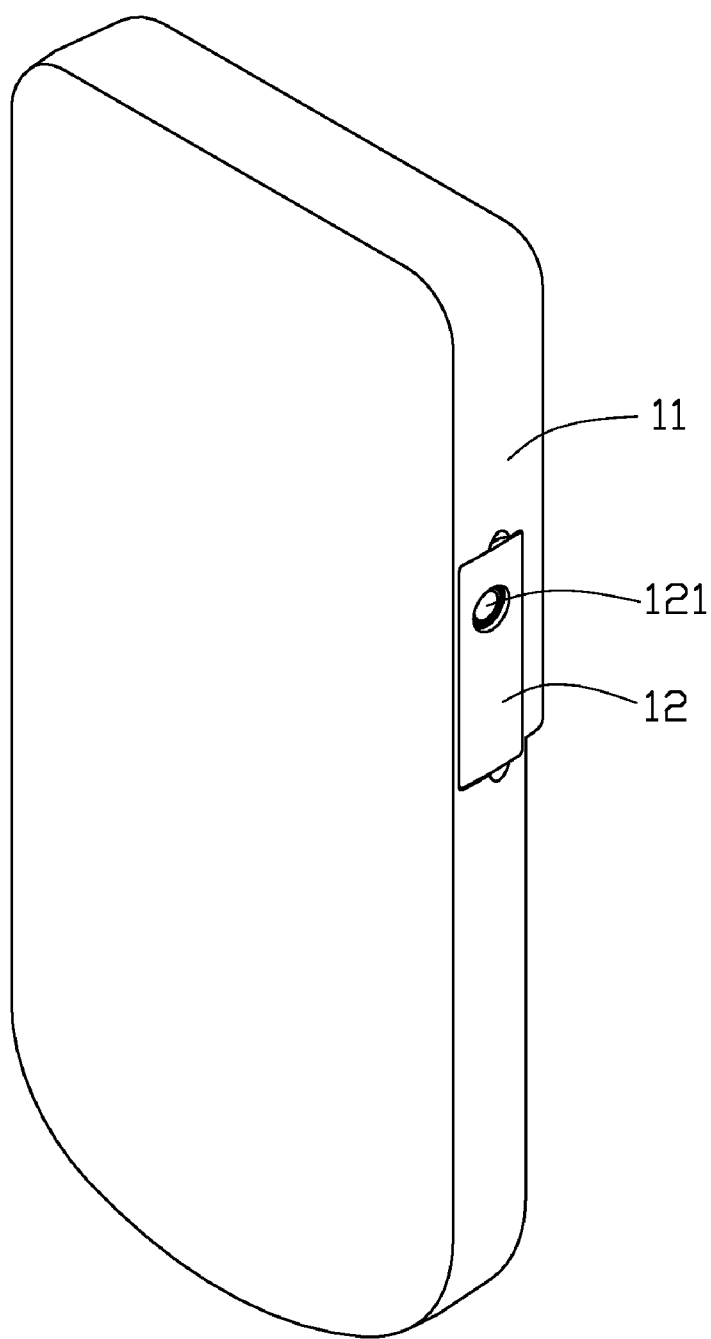
FIG. 5 is a second position of the cover assembly shown in FIG. 3, corresponding to an opening/closing operation of the cover assembly.

FIGS. 4 and 5 show the cover member 12 in stages of being moved from the above-described position (i.e., closed position) to an open position. In use, the latches 123 are detached from the latching slots 133. Then the cover member 12 can be pulled away from the body member 11 until the cover member 12 is completely detached from the mounting portion 13. At this time, the resisting portion 1222 is still received in the body member 11 and abuts against the inner wall of the body member 11. Then the cover member 12 can be rotated about the rotating portion 1221 until the earphone hole 131 is aligned with the through hole 121, pressed back to latch with the mounting portion 13, and then the earphone hole 131 is ready for use.

The cover member 12 can be rotated relative to the body member 11 to expose or cover the earphone hole 131, avoiding the need for a deformable, flexible strip that will wear all to easily, thus a long lasting cover assembly 10 is provided.

It is to be understood, however, that even through numerous characteristics and advantages of the present invention have been set forth in the foregoing description, together with details of the structure and function of the invention, the disclosure is illustrative only, and changes may be made in detail, especially in matters of shape, size, and arrangement of members within the principles of the invention to the full extent indicated by the broad general meaning of the terms, in which the appended claims are expressed.

What is claimed is:

1. A cover assembly, comprising:
   a body member including an outer surface, a mounting portion formed on the outer surface and defining an earphone hole; and
   a rotatable cover member defining a through hole, in a first position, the through hole of the cover member overlies a solid portion of the mounting portion and the earphone hole is covered and when the rotatable cover member is in a second position, the through hole is aligned with the earphone hole.

2. The cover assembly as claimed in claim 1, wherein the mounting portion defines a hole adjacent to the earphone hole, the cover member is a plate, and has a rotating column protruding from a side thereof and facing mounting portion of the body member, the rotating column is rotatably received in the hole, and a distance between the rotating column and the through hole is equal to that between the earphone hole and the hole.

3. The cover assembly as claimed in claim 2, wherein the rotating column has a resisting portion disposed at a distal end thereof, and the resisting portion is deformed to be received in the body member through the hole.

4. The cover assembly as claimed in claim 2, wherein the cover member includes a plurality of latches protruding therefrom, the mounting portion defines a plurality of latching holes, and the latches are interlocked in the corresponding latching holes.

5. A cover assembly, comprising:
- a body member including a peripheral wall, a mounted portion formed on the peripheral wall and defining an earphone hole; and
- a rotatable cover member received in the mounted portion and being flushing with the peripheral wall, in a first position, the through hole of the cover member overlies a solid portion of the mounting portion and the earphone hole is covered and when the rotatable cover member is in a second position, the through hole is aligned with the earphone hole.

6. The cover assembly as claimed in claim 5, wherein the mounted portion defines a hole adjacent to the earphone hole, the cover member including a rotating column engaged in the hole, a distance between the rotating column and the through hole is equal to that between the earphone hole and the hole.

7. The cover assembly as claimed in claim 6, wherein the cover member includes a plurality of latches, the mounting portion defines a plurality of latching holes, and the latches are interlocked in the corresponding latching holes.

* * * * *